United States Patent
Kim

(10) Patent No.: US 7,128,271 B2
(45) Date of Patent: Oct. 31, 2006

(54) SEMICONDUCTOR INTEGRATED CIRCUIT AND METHODS FOR PROTECTING THE CIRCUIT FROM REVERSE ENGINEERING

(75) Inventor: Jong-Cheol Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 158 days.

(21) Appl. No.: 10/891,860

(22) Filed: Jul. 15, 2004

(65) Prior Publication Data

US 2005/0017752 A1     Jan. 27, 2005

(30) Foreign Application Priority Data

Jul. 22, 2003    (KR) .................. 10-2003-0050345

(51) Int. Cl.
*G06K 13/00*     (2006.01)
(52) U.S. Cl. ....................................................... 235/476
(58) Field of Classification Search ................. 235/476
See application file for complete search history.

(56) References Cited

U.S. PATENT DOCUMENTS 5,146,117 A    9/1992   Larson
5,336,624 A *   8/1994   Walden ..................... 438/200
6,410,413 B1 *   6/2002   Scott et al. ................ 438/601
6,893,916 B1 *   5/2005   Baukus et al. ............ 438/253

FOREIGN PATENT DOCUMENTS

JP         9-92727      4/1997

* cited by examiner

*Primary Examiner*—Daniel Stcyr
(74) *Attorney, Agent, or Firm*—F. Chau & Associates, LLC

(57) ABSTRACT

A semiconductor integrated circuit having a reverse engineering protection part that can be easily implemented without additional circuitry or process using a method for protecting against reverse engineering of the semiconductor integrated circuit. The semiconductor integrated circuit includes a logic gate and a reverse engineering protection part. The reverse engineering protection part alters the apparent Boolean functions of a logic gate. Further, the reverse engineering protection part includes at least one PMOS transistor and at least one NMOS transistor. The PMOS and NMOS transistors are constructed to remain in a state of constant on or off irrespective of an input signal applied to their gates. The PMOS transistors and the NMOS transistors are included in transistors forming the logic gate. The PMOS transistors and the NMOS transistors that remain in a state of constant on or off are formed by implanting ions into their gate channels or blocking ion implantation into their gate channels during manufacturing.

10 Claims, 8 Drawing Sheets

US 7,128,271 B2

SEMICONDUCTOR INTEGRATED CIRCUIT AND METHODS FOR PROTECTING THE CIRCUIT FROM REVERSE ENGINEERING

CROSS REFERENCE TO RELATED APPLICATION

This application claims priority to Korean Patent Application No. 2003-50345, filed on Jul. 22, 2003, in the Korean Intellectual Property Office, the disclosure of which is hereby incorporated by reference.

BACKGROUND

1. Technical Field

The present invention relates to a semiconductor integrated circuit, and more particularly, to a semiconductor integrated circuit including a reverse engineering protection part and a method for protecting against reverse engineering of an integrated circuit.

2. Discussion of the Related Art

Semiconductor integrated circuits are often reverse engineered for the purpose of extracting circuits embedded in semiconductor devices. To prevent such reverse engineering, a variety of methods have been suggested. For example, U.S. Pat. No. 6,294,816 discloses a method of using implanted interconnections to replace metal interconnects to connect doped circuit elements. Since such implanted interconnections are not visible to SEM or optical viewing techniques, the purpose or function of the protected circuits are disguised from a reverse engineer. However, conventional methods for preventing reverse engineering require additional circuitry or additional processing.

SUMMARY OF THE INVENTION

Exemplary embodiments of the present invention include a semiconductor integrated circuit that comprises a reverse engineering protection part and method, which can be readily implemented without the need for additional circuitry or additional processing.

In one exemplary embodiment of the present invention, a semiconductor integrated circuit comprises a logic gate and a reverse engineering protection part that allows the logic gate to operate in a different mode from a Boolean function shown in the top view circuitry design of the logic gate. The reverse engineering protection part comprises at least one PMOS transistor and at least one NMOS transistor. At least one PMOS transistor remains in a constant on or off state irrespective of an input signal applied to its gate, and at least one NMOS transistor remains in a constant on or off state irrespective of an input signal applied to its gate. The PMOS transistor and the NMOS transistor are both included in transistors forming the logic gate. Further, in another embodiment, the PMOS transistor that remains in a constant on or off state is formed by implanting ions into a gate channel or by blocking ion implantation into the gate channel during manufacturing. The NMOS transistor that remains in a constant on or off state is formed by implanting ions into a gate channel or by blocking ion implantation into the gate channel during manufacturing.

In another exemplary embodiment of the present invention, a method for protecting against reverse engineering of a semiconductor integrated circuit includes a plurality of logic gates having at least one PMOS transistor and at least one NMOS transistor. The method for protecting against reverse engineering comprises implanting ions into a gate channel of the at least one PMOS transistor or blocking ion implantation into the gate channel during manufacturing, to maintain the at least one PMOS transistor in a constant on or off state, irrespective of an input signal applied to a gate of the PMOS transistor and implanting ions into a gate channel of the at least one NMOS transistor or blocking ion implantation into the gate channel during manufacturing, to maintain the at least one NMOS transistor in a constant on or off state irrespective of an input signal applied to a gate of the NMOS transistor.

BRIEF DESCRIPTION OF THE DRAWINGS

The features of the present invention will become more apparent by describing in detailed exemplary embodiments thereof with reference to the attached drawings in which.

DETAILED DESCRIPTION OF PREFERRED EMBODIMENTS OF THE INVENTION

Figure 1:
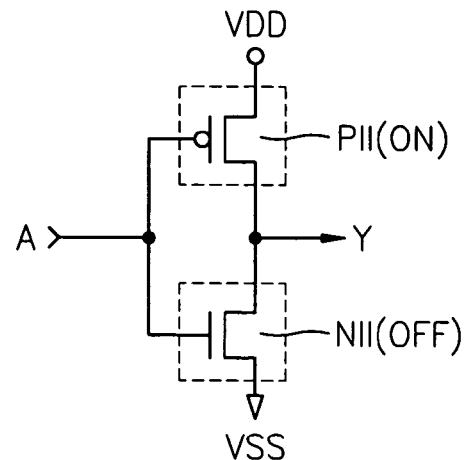
FIG. 1 is a circuit diagram of an inverter including a reverse engineering protection part according to an exemplary embodiment of the present invention.

The embodiments of the present invention will now be described in further detail with reference to the accompanying drawings. In the drawings, like reference numerals are used to refer to like elements throughout.

Figure 2:
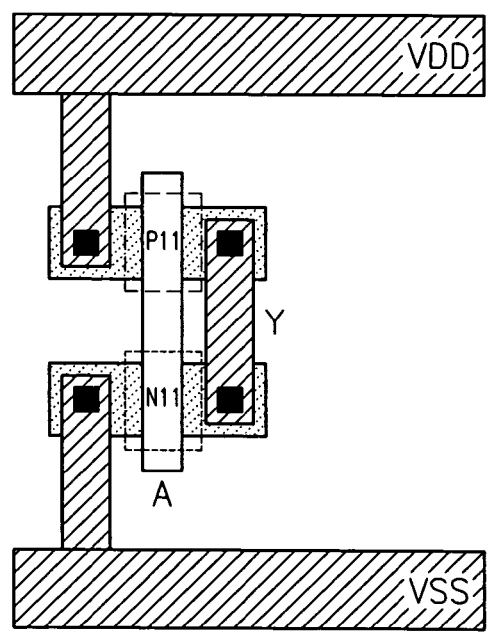
FIG. 2 illustrates a top view circuitry design picture of the inverter of FIG. 1.

FIG. 1 is a circuit diagram of an inverter including a reverse engineering protection part according to an exemplary embodiment of the present invention and FIG. 2 illustrates a top view circuitry design picture of the inverter of FIG. 1, which is obtained after decapsulation of the inverter.

Referring to FIG. 1, an inverter includes a PMOS transistor P11 and NMOS transistor N11. The PMOS transistor P11 is connected between a supply voltage node having a voltage of VDD and an output terminal Y and has a gate to which an input signal A is applied. The NMOS transistor N11 is connected between the output terminal Y and a voltage VSS or ground and has a gate to which the input signal A is applied.

According to another embodiment of the present invention, one or more PMOS transistors forming a logic gate are maintained in a state of constant on or off irrespective of an input signal applied to their gates. Also, one or more NMOS transistors forming a logic gate are maintained in a state of constant on or off irrespective of the input signal applied to their gates.

The PMOS transistors that are maintained in a constant on or off state irrespective of the input signal applied to their gates can be formed by implanting ions into their gate channels or blocking ion implantation into their gate channels during manufacturing. Similarly, the NMOS transistors that are maintained in a constant on or off state irrespective of the input signal applied to their gates can be formed by implanting ions into their gate channels or blocking ion implantation into their gate channels during manufacturing. These PMOS and NMOS transistors operate differently from ordinary PMOS and NMOS transistors, but they are the same as ordinary PMOS and NMOS transistors in appearance, i.e., their architecture designs are the same as those of ordinary PMOS and NMOS transistors.

As shown in FIGS. 1 and 2, the PMOS transistor P11 is maintained in a constant on state, the NMOS transistor N11 is maintained in a constant off state, and the output terminal Y is a logic "high" at all times, irrespective of the input signal A. In other words, the architecture design of FIG. 2 is an ordinary inverter in appearance, but it outputs a logic "high" at all times irrespective of the input signal A, instead of functioning as an inverter. That is, the logic circuit of FIG. 2 operates in a different mode from an ordinary inverter, which is shown in the top view circuitry design of the circuit in FIG. 1.

In another exemplary embodiment, the PMOS transistor P11 is maintained in a constant off state, the NMOS transistor N11 is maintained in a constant on state, and the output terminal Y is a logic "low" at all times, irrespective of the input signal A. In this case, the architecture design of FIG. 2 is an ordinary inverter in appearance, but it outputs a logic "low" at substantially all times irrespective of the input signal A.

Thus, if one attempts to reverse engineer and extract a circuit from the top view circuitry design picture of FIG. 2, the circuit does not operate as an inverter; however, since it appears to be an inverter, an inverter is extracted. Therefore, reverse engineering of the circuit of FIG. 2 will result in an erroneously extracted circuit.

Figure 3:
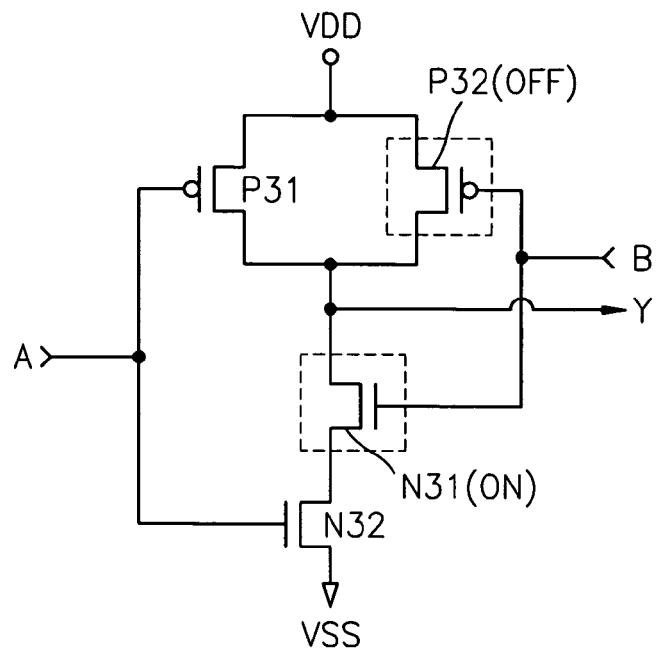
FIG. 3 is a circuit diagram of a NAND gate including a reverse engineering protection part according to another exemplary embodiment of the present invention.
Figure 4:
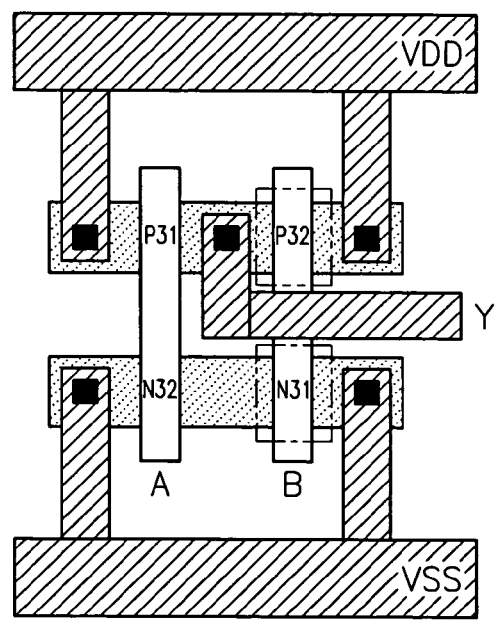
FIG. 4 illustrates a top view circuitry design picture of the NAND gate of FIG. 3.

FIG. 3 is a circuit diagram of a NAND gate including a reverse engineering protection part according to another exemplary embodiment of the present invention and FIG. 4 illustrates a top view circuitry design picture of the NAND gate of FIG. 3.

Referring to FIG. 3, a NAND gate includes a plurality of PMOS transistors P31 and P32 and a plurality of NMOS transistors N31 and N32. The plurality of PMOS transistors P31 and P32 are connected in parallel between a supply voltage node having a voltage of VDD and an output terminal Y. The plurality of NMOS transistors N31 and N32 are connected in series between the output terminal Y and a voltage VSS or ground. Here, the NAND gate is a 2-input NAND gate, an input signal A is input to the gates of the PMOS transistor P31 and the NMOS transistor N32, and an input signal B is input to the gates of the PMOS transistor P32 and the NMOS transistor N31.

As shown in FIGS. 3 and 4, the PMOS transistor P32 is maintained in a constant off state, the NMOS transistor N31 is maintained in a constant on state, and the NAND gate of FIG. 3 operates as an inverter. In other words, the top view circuitry design of FIG. 4 is an ordinary NAND gate in appearance, but functions essentially as an inverter instead of a NAND gate. That is, the circuit's apparent function, a Boolean NAND function, is in reality an inverter function.

It should be noted that although the PMOS transistor P32 is described as in a state of constant off and the NMOS transistor N31 is described as in a state of constant on, a variety of combinations are available to allow the circuit of FIG. 3 to operate in different Boolean functions in addition to a function as an inverter.

Thus, if one attempts to reverse engineer and extract a circuit from the top view circuitry design picture of FIG. 4, the circuit does not operate as a NAND gate; however, since it appears to be a NAND gate, a circuit of a NAND gate would be extracted if an attempt to reverse engineer was made. Therefore, reverse engineering of the circuit of FIG. 4 will result in an erroneously extracted circuit.

Figure 5:
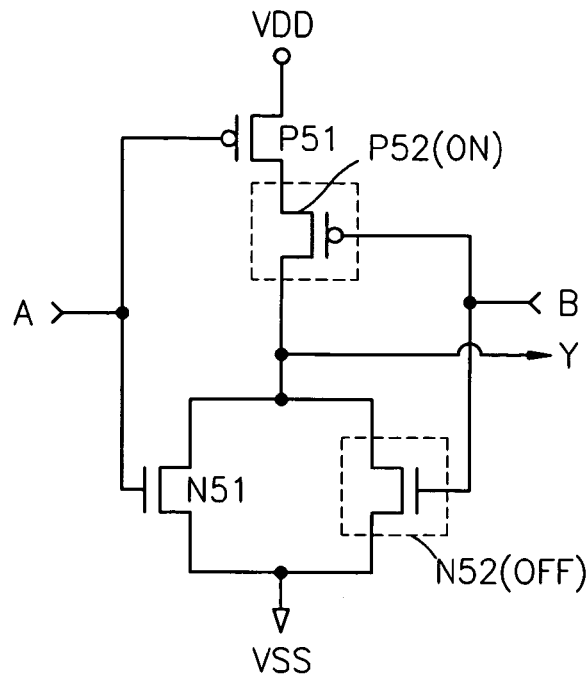
FIG. 5 is a circuit diagram of a NOR gate including a reverse engineering protection part according to yet another exemplary embodiment of the present invention.
Figure 6:
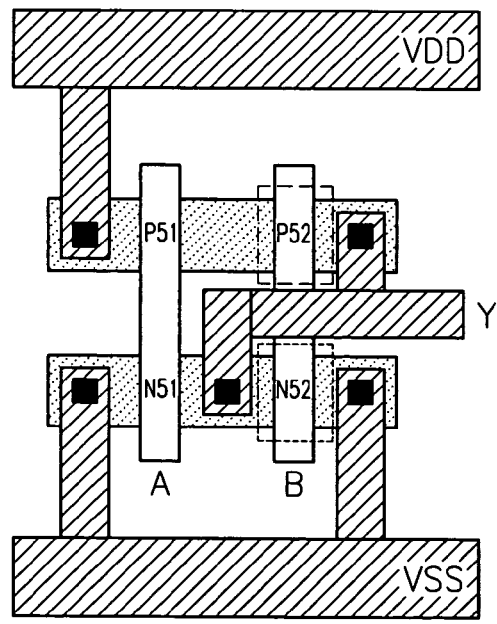
FIG. 6 illustrates a top view circuitry design picture of the NOR gate of FIG. 5.

FIG. 5 is a circuit diagram of a NOR gate including a reverse engineering protection part according to yet another exemplary embodiment of the present invention and FIG. 6 illustrates a top view circuitry design picture of the NOR gate of FIG. 5.

Referring to FIG. 5, a NOR gate includes a plurality of PMOS transistors P51 and P52 and a plurality of NMOS transistors N51 and N52. The plurality of PMOS transistors P51 and P52 are connected in series between a supply voltage node having a voltage of VDD and an output terminal Y. The plurality of NMOS transistors N51 and N52 are connected in parallel between the output terminal Y and a voltage VSS or ground. Here, the NAND gate is a 2-input NAND gate, an input signal A is input to the gates of the PMOS transistor P51 and the NMOS transistor N51, and an input signal B is input to the gates of the PMOS transistor P52 and the NMOS transistor N52.

As shown in FIGS. 5 and 6, the PMOS transistor P52 is maintained in a constant on state, the NMOS transistor N52 is maintained in a constant off state, and the NOR gate of FIG. 5 operates as an inverter. In other words, the top view circuitry design of FIG. 6 shows an ordinary NOR gate in appearance, but it operates essentially as an inverter instead of a NOR gate. That is, one of the circuit's inherent functions, such as a Boolean NOR function has been altered to a function as an inverter.

It should be noted that although the PMOS transistor P52 is described as being maintained in a constant on state and the NMOS transistor N52 is described as being maintained in a constant off state, a variety of combinations are available to allow the circuit of FIG. 5 to operate in different Boolean functions in addition to a function of an inverter.

Thus, if one attempts to reverse engineer and extract a circuit from the top view circuitry design picture of FIG. 6, the circuit does not operate as a NOR gate; however, since the top view circuitry appears to be a NOR gate, a circuit of a NOR gate is extracted. Therefore, reverse engineering of the circuit of FIG. 6 will result in an erroneously extracted circuit.

Figure 7:
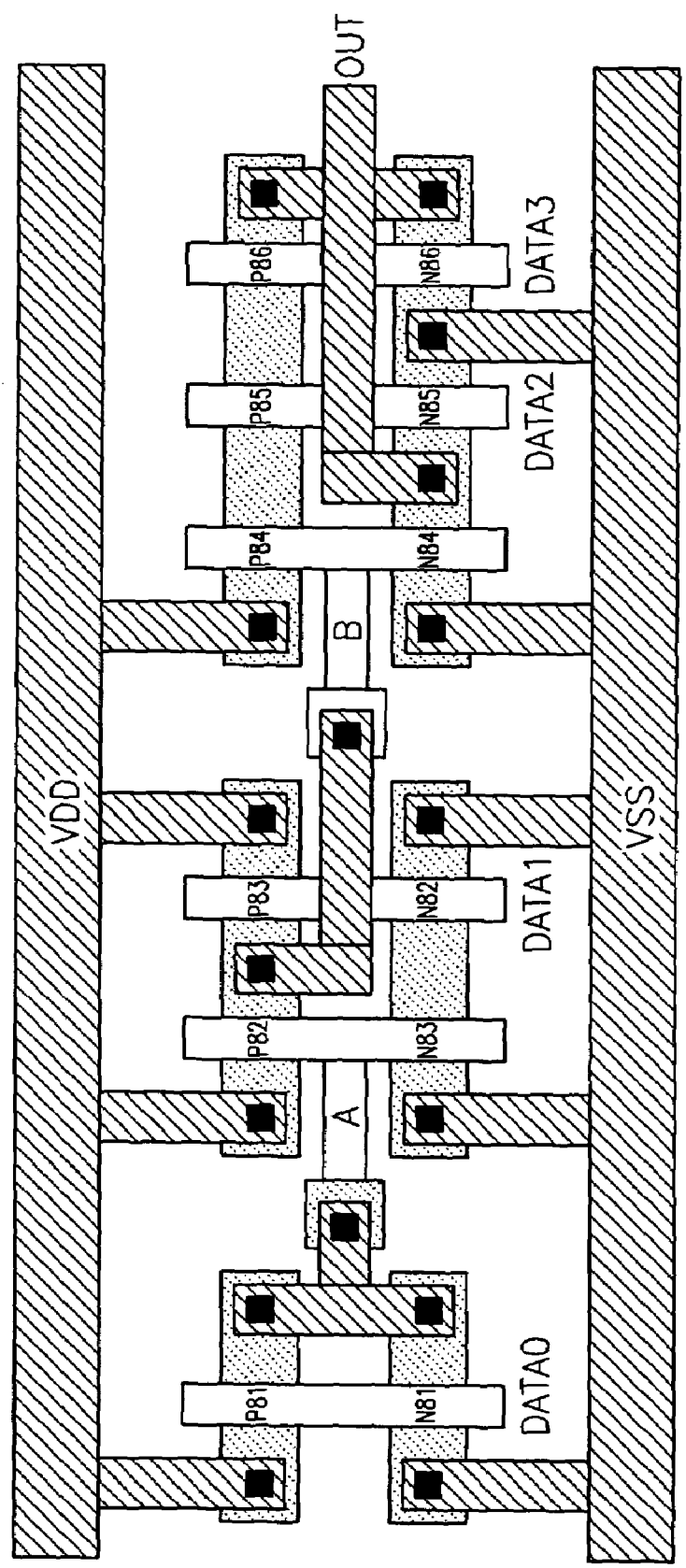
FIG. 7 illustrates a top view circuitry design picture of an integrated circuit without a reverse engineering protection part according to still another exemplary embodiment of the present invention.
Figure 8:
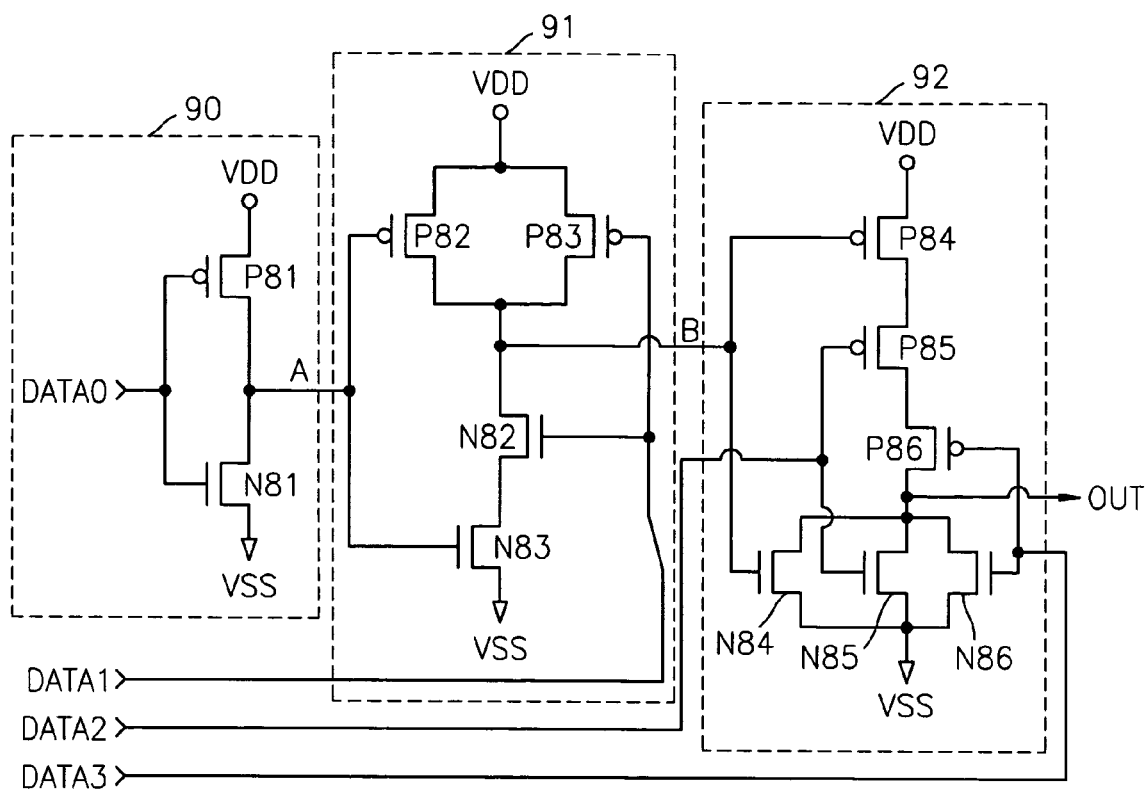
FIG. 8 illustrates a circuit extracted from the layout of FIG. 7.
Figure 9:
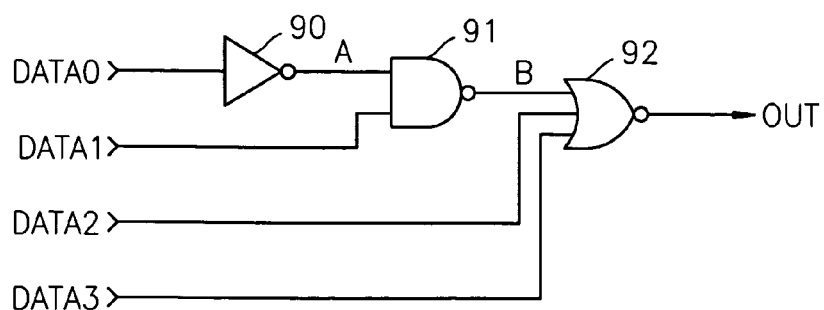
FIG. 9 illustrates a logic circuit of the circuit of FIG. 8.

FIGS. 7, 8 and 9 illustrate an integrated circuit comprising a plurality of logic gates without a reverse engineering protection part. FIG. 7 illustrates the top view circuitry design picture of the integrated circuit without a reverse engineering protection part. FIG. 8 illustrates a circuit extracted from the top view circuitry design of FIG. 7. FIG. 9 illustrates the schematic diagram of the integrated circuit of FIGS. 7 and 8.

Figure 10:
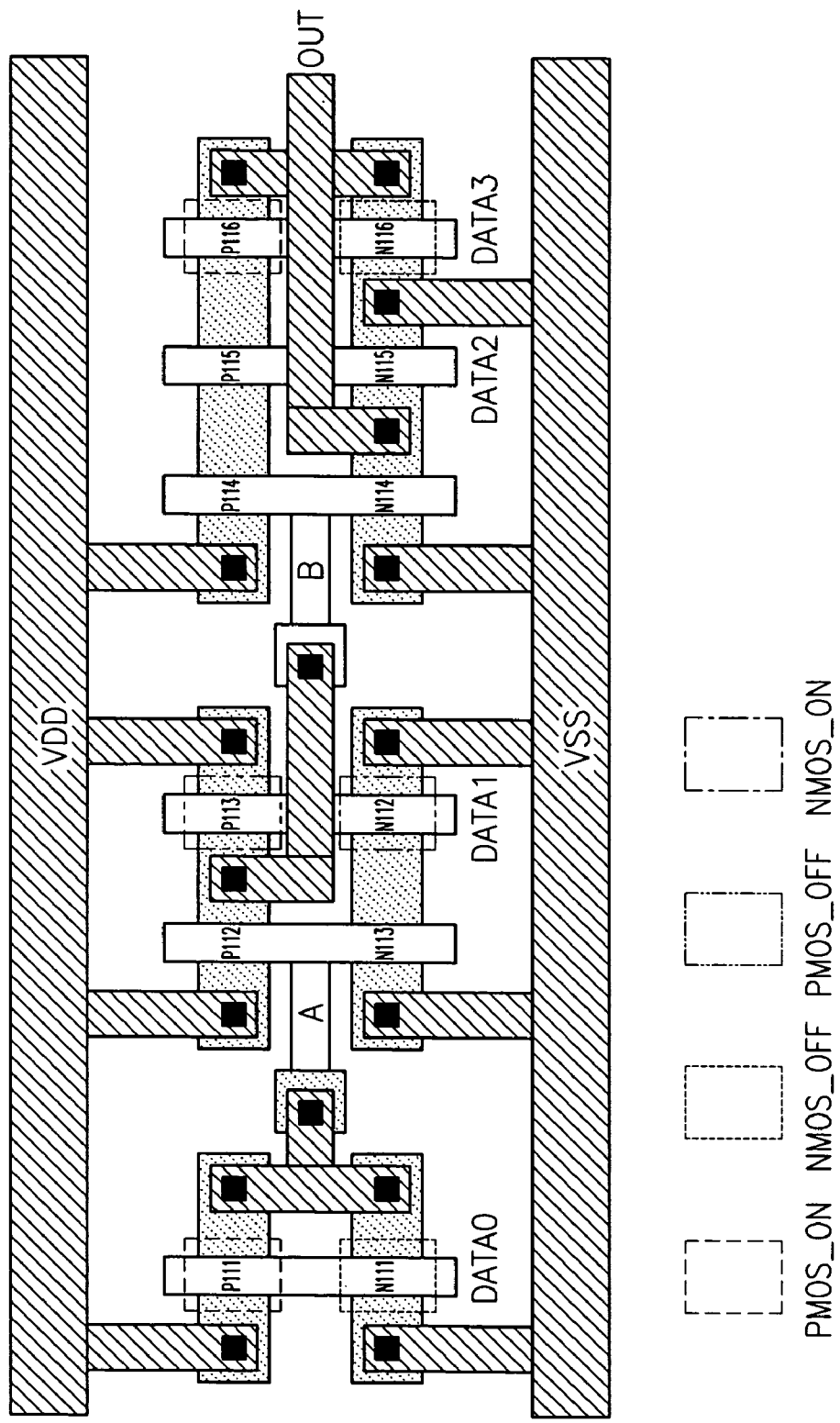
FIG. 10 illustrates a decap picture of an integrated circuit without a reverse engineering protection part according to an exemplary embodiment of the present invention.
Figure 11:
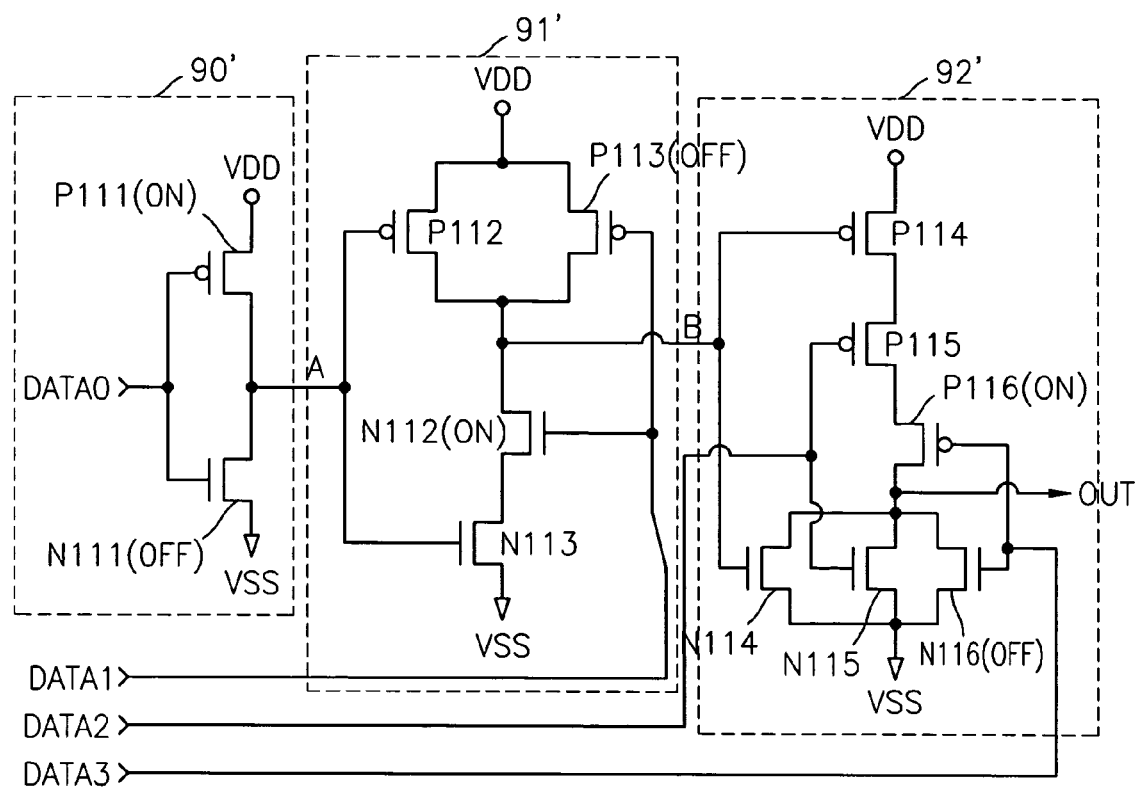
FIG. 11 illustrates a circuit corresponding to the layout of FIG. 10.
Figure 12:
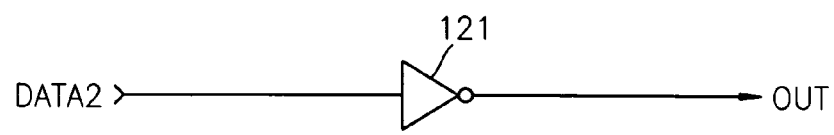
FIG. 12 illustrates a logic circuit of the circuit of FIG. 11.

FIGS. 10, 11 and 12 illustrate an integrated circuit comprising a plurality of logic gates with reverse engineering protection parts. FIG. 10 illustrates a top view circuitry design that appears to be the same as the one showing in FIG. 7. FIG. 11 illustrates a circuit with reverse engineering parts and having a top view circuitry design of FIG. 10, which is the same as FIG. 7. FIG. 12 illustrates a schematic diagram of the integrated circuit of FIGS. 10 and 11.

As shown in FIGS. 8 and 11, logic gate 90 (90') is an inverter and comprises an NMOS transistor N81 (N111) and a PMOS transistor P81 (P111); The PMOS transistor P81 (P111) is connected between a supply voltage node having a voltage of VDD and an output terminal A and has a gate to which an input signal DATA0 is applied. The NMOS transistor N81 (N111) is connected between the output terminal A and a voltage VSS or ground and has a gate to which the input signal DATA0 is applied. FIGS. 8 and 11 further show two NAND gates 91 and 91', which include a plurality of PMOS transistors P82 (P112) and P83 (P113) and a plurality of NMOS transistors N82 (N112) and N83 (N113). The plurality of PMOS transistors P82 (P112) and P83 (P113) are connected in parallel between a supply voltage node having a voltage of VDD and an output terminal B. The plurality of NMOS transistors N82 (N112) and N83 (N113) are connected in series between the output terminal B and a voltage VSS or ground. Here, the NAND gated 91 and 91' are 2-input NAND gates, an input signal A is input to the gates of the PMOS transistor P82 (P112) and the NMOS transistor N83 (N113), and an input signal DATA1 is input to the gates of the PMOS transistor P83 (P113) and the NMOS transistor N82 (N112). Furthermore, FIGS. 8 and 11 also show two NOR gates including a plurality of PMOS transistors P84 (P114), P85 (P115) and P86 (P116) and a plurality of NMOS transistors N84 (N114), N85 (N115) and N86 (N116). The plurality of PMOS transistors P84 (P114), P85 (P115), and P86 (P116) are connected in series between a supply voltage node having a voltage of VDD and an output terminal OUT. The plurality of NMOS transistors N84 (N114), N85 (N115), and N86 (N116) are connected in parallel between the output terminal OUT and a voltage VSS or ground. Here, the two NAND gates are 3-input NAND gates, an input signal B is input to the gates of the PMOS transistor P84 (P114) and the NMOS transistor N84 (N114), an input signal DATA2 is input to the gates of the PMOS transistor P85 (P115) and the NMOS transistor N85 (N115), and an input signal DATA3 is input to the gates of the PMOS transistor P86 (P116) and NMOS transistor N86 (N116).

The integrated circuit of FIG. 7 does not include a reverse engineering protection part, that is, without a PMOS transistor that remains in a constant on or off state irrespective of an input signal applied to its gate and an NMOS transistor that remains in a constant on or off state irrespective of an input signal applied to its gate. In this case, if one attempts to reverse engineer and extract a circuit from the top view circuitry design of FIG. 7, the circuit of FIG. 8 would be extracted. The circuit of FIG. 8 can be expressed as a logic circuit, as shown in a schematic diagram of FIG. 9.

FIG. 10 shows another exemplary embodiment of the present invention. In FIG. 10, it is assumed that transistors P111, N112, and P116 are maintained in a constant on state and transistors N111, P113, and N116 are maintained in a constant off state. Although these transistors appears to be the same as ordinary transistors as those shown in FIG. 7, they operates in different modes than their counterparts in FIG. 7. Hence, the logic gates 90', 91' and 92' comprising these transistors also operate in modes that are different from that of the logic gates 90, 91 and 92 shown in FIG. 8. As a result, FIG. 12, a schematic diagram of FIG. 11 shows an inverter 121, which is different from FIG. 9, the schematic diagram of FIG. 8. Therefore, although FIG. 10 shows a circuit having the same top view circuitry design as the circuit of FIG. 7, the circuit of FIG. 10 operates differently than the circuit of FIG. 7. Therefore, if one reverse engineers and attempts to extract a circuit from the top view circuitry design of FIG. 10, the circuit of FIG. 8 will be extracted, and the logic circuit of FIG. 9 would be obtained. However, the actual circuit corresponding to the layout of FIG. 10 is a circuit of FIG. 1. The circuit of FIG. 11 can be expressed as a logic circuit, as shown in a schematic design of FIG. 12.

Figure 13:
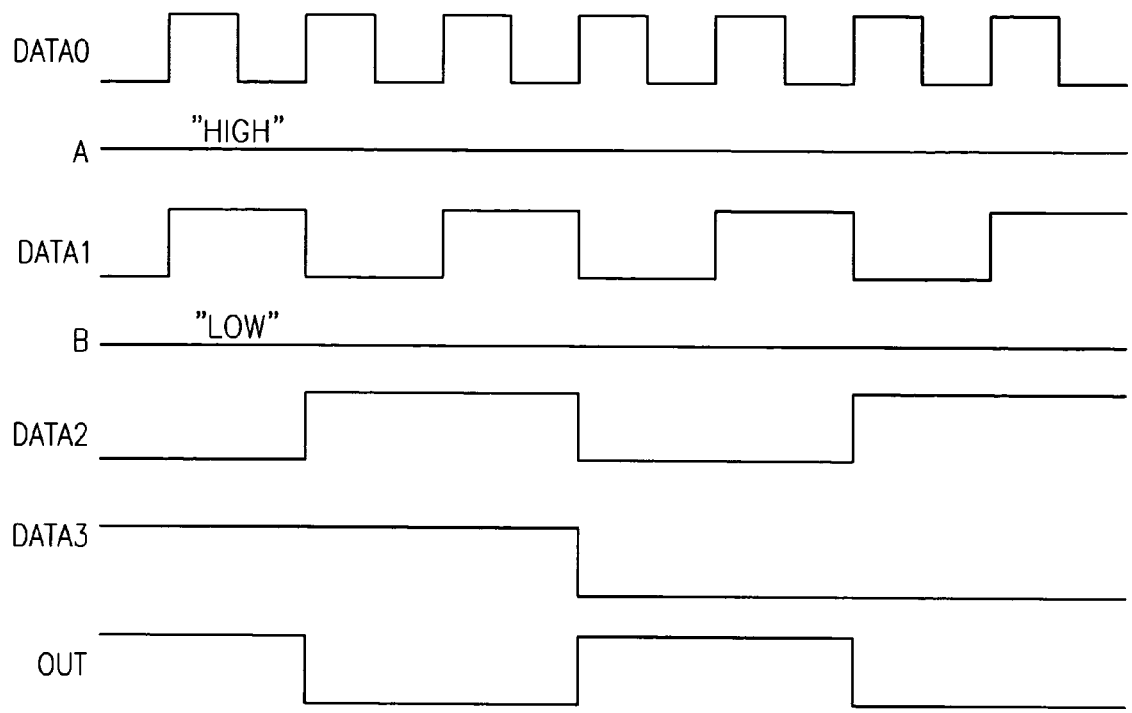
FIG. 13 is an exemplary timing diagram illustrating an exemplary mode of operation of the circuit of FIG. 11.

FIG. 13 is a timing diagram for the operation of the circuit of FIG. 11. Referring to FIG. 13, an output signal OUT is irrelevant to DATA0, DATA1, and DATA3, but is 180° out of phase with DATA2.

In conclusion, if a circuit is to be extracted from the top view circuitry design of FIG. 10, a circuit operates in different modes than its actual modes would be extracted. Therefore, reverse engineering of the circuit of FIG. 11 will result in an erroneously extracted circuit.

As described above, in an integrated circuit having a reverse engineering protection part according to the present invention, transistors that appear to be ordinary transistors as shown in their architecture designs but have different functions from those of ordinary transistors are formed. As a result, if a circuit is to be extracted from a top view circuitry design picture, a circuit having different functions from their actual functions would be extracted. As a result, the reverse engineering protection part is capable of protecting functions of the integrated circuit and preventing reverse engineering.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A semiconductor integrated circuit comprising:
   a logic gate; and
   a reverse engineering protection part, which alters the Boolean functions of a logic gate that upon inspection appears to function in a known manner, wherein the reverse engineering protection part comprises:
   at least one PMOS transistor, which remains in a constant on or constant off state irrespective of an input signal applied to a gate of the at least one PMOS transistor; and
   at least one NMOS transistor, which remains in a constant on or constant off state that is opposite to the state of the at least one PMOS transistor irrespective of an input signal applied to a gate of the at least one NMOS transistor,
   wherein the at least one PMOS transistor and the at least one NMOS transistor are included in transistors forming the logic gate.

2. The semiconductor integrated circuit of claim 1, wherein the at least one PMOS transistor that remains in a constant on or constant off state is formed by implanting ions into a gate channel of the at least one PMOS transistor or blocking ion implantation into the gate channel of the at least one PMOS transistor during manufacturing.

3. The semiconductor integrated circuit of claim 1, wherein the at least one NMOS transistor that remains in a constant on or constant off state is formed by implanting ions into a gate channel of the at least one NMOS transistor or blocking ion implantation into the gate channel of the at least one NMOS transistor during manufacturing.

4. The semiconductor integrated circuit of claim 1, wherein:
   a PMOS transistor is connected between a node having a supply voltage and an output terminal and has a gate to which an input signal is applied; and
   an NMOS transistor is connected between the output terminal and ground and has a gate to which the input signal is applied,
   wherein the PMOS and NMOS transistors remain in a constant on or constant off state irrespective of the input signal.

5. The semiconductor integrated circuit of claim 1, wherein:
   the at least one PMOS transistor includes a plurality of PMOS transistors, which are connected in parallel between a node having a supply voltage and an output terminal; and
   the at least one NMOS transistor includes a plurality of NMOS transistors, which are connected in series between the output terminal and ground,
   wherein at least one of the plurality of PMOS transistors remains in a constant on or constant off state irrespective of an input signal and at least one of the plurality of NMOS transistors remains in a constant on or constant off state irrespective of the input signal.

6. The semiconductor integrated circuit of claim 1, wherein:
   the at least one PMOS transistor includes a plurality of PMOS transistors, which are connected in series between a supply voltage and an output terminal; and
   the at least one NMOS transistor includes a plurality of NMOS transistors, which are connected in parallel between the output terminal and a ground voltage,
   wherein at least one of the plurality of PMOS transistors remains in a constant on or constant off state irrespective of an input signal and at least one of the plurality of NMOS transistors remains in a constant on or constant off state irrespective of the input signal.

7. A method for protecting against reverse engineering of a semiconductor integrated circuit including a plurality of logic gates having at least one PMOS transistor and at least one NMOS transistor, the method comprising:
   constructing at least one PMOS transistor to remain in a constant on or constant off state irrespective of an input signal applied to a gate of the at least one PMOS transistor by implanting ions into a gate channel of the at least one PMOS transistor or blocking ion implantation into the gate channel of the at least one PMOS transistor during manufacturing thereof; and
   constructing at least one NMOS transistor to remain in a constant on or constant off state that is opposite to the state of the at least one PMOS transistor irrespective of an input signal applied to a gate of the at least one NMOS transistor by implanting ions into a gate channel of the at least one NMOS transistor or blocking ion implantation into the gate channel of the at least one NMOS transistor during manufacturing thereof.

8. The method for protecting against reverse engineering according to claim 7, further comprising:
   connecting a PMOS transistor between a supply voltage and an output terminal and applying an input signal to the gate of the PMOS transistor;
   connecting an NMOS transistor between the output terminal and ground; and applying the input signal to the gate of the NMOS transistor; and
   maintaining the PMOS and NMOS transistors in a constant on or constant off state irrespective of the input signal.

9. The method for protecting against reverse engineering according to claim 7, further comprising:
   connecting a plurality of PMOS transistors in parallel between a node having a supply voltage and an output terminal;
   connecting a plurality of NMOS transistors in series between the output terminal and ground; and
   maintaining at least one of the plurality of PMOS transistors in a state of constant on or constant off irrespective of an input signal and at least one of the plurality of NMOS transistors in a constant on or constant off state irrespective of the input signal.

10. The method for protecting against reverse engineering according to claim 7, further comprising:
   connecting a plurality of PMOS transistors in series between a node having a supply voltage and an output terminal;
   connecting a plurality of NMOS transistors in parallel between the output terminal and ground; and
   maintaining at least one of the plurality of PMOS transistors in a constant on or constant off state irrespective of an input signal and at least one of the plurality of NMOS transistors in a constant on or constant off state irrespective of the input signal.

* * * * *